United States Patent
Kawanabe et al.

(10) Patent No.: US 10,217,613 B2
(45) Date of Patent: Feb. 26, 2019

(54) PLASMA PROCESSING APPARATUS

(71) Applicant: HITACHI HIGH-TECHNOLOGIES CORPORATION, Tokyo (JP)

(72) Inventors: Tetsuo Kawanabe, Tokyo (JP); Takumi Tandou, Tokyo (JP); Tsutomu Tetsuka, Tokyo (JP); Naoki Yasui, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 18 days.

(21) Appl. No.: 15/273,812

(22) Filed: Sep. 23, 2016

(65) Prior Publication Data

US 2017/0186587 A1 Jun. 29, 2017

(30) Foreign Application Priority Data

Dec. 28, 2015 (JP) .................. 2015-257260

(51) Int. Cl.
| | |
|---|---|
| *H01J 37/32* | (2006.01) |
| *H01L 21/67* | (2006.01) |
| *C23C 16/452* | (2006.01) |
| *C23C 16/458* | (2006.01) |

(Continued)

(52) U.S. Cl.
CPC ...... *H01J 37/32348* (2013.01); *C23C 16/452* (2013.01); *C23C 16/4585* (2013.01); *C23C 16/517* (2013.01); *H01J 37/3244* (2013.01); *H01J 37/32082* (2013.01); *H01J 37/32165* (2013.01); *H01J 37/32192* (2013.01); *H01J 37/32458* (2013.01); *H01J 37/32532* (2013.01); *H01J 37/32541* (2013.01);

(Continued)

(58) Field of Classification Search
CPC .......... H01J 37/32348; H01J 37/32082; H01J 37/32165; H01J 37/32302; H01J 37/32192; H01L 21/68735
USPC ........................................ 118/728
See application file for complete search history.

(56) References Cited

U.S. PATENT DOCUMENTS

| | | | | |
|---|---|---|---|---|
| 6,039,836 A | * | 3/2000 | Dhindsa | H01J 37/32623 156/345.1 |
| 6,475,336 B1 | * | 11/2002 | Hubacek | C23C 16/4585 118/723 E |
| 9,852,889 B1 | * | 12/2017 | Kellogg | H01J 37/32091 |
| 2004/0261946 A1 | * | 12/2004 | Endoh | H01J 37/32082 156/345.15 |

(Continued)

FOREIGN PATENT DOCUMENTS

| | | |
|---|---|---|
| JP | 09-162169 A | 6/1997 |
| JP | 2013-084653 A | 5/2013 |

*Primary Examiner* — Charlee J C Bennett
(74) *Attorney, Agent, or Firm* — Mattingly & Malur, PC

(57) ABSTRACT

A plasma processor, including a first gas supplier to supply first gas to the inside of a vacuum vessel, a stage on which a wafer is placed, an electromagnetic wave supplier to supply electromagnetic waves for generating first plasma, a susceptor provided to an outer peripheral portion of the stage, a second high frequency power source connected to the susceptor, and a second gas supplier to supply second gas to the inside of the susceptor. The inside of the susceptor is provided with a high frequency electrode connected to the second high frequency power source and a first earth electrode disposed opposite to the high frequency electrode. The second high frequency power source supplies high frequency power while the second gas supplier supplies the second gas, thereby generating second plasma inside the susceptor.

10 Claims, 5 Drawing Sheets

(51) Int. Cl.
*C23C 16/517* (2006.01)
*H01L 21/687* (2006.01)

(52) U.S. Cl.
CPC .. *H01J 37/32568* (2013.01); *H01J 37/32715* (2013.01); *H01L 21/68735* (2013.01)

(56) References Cited

U.S. PATENT DOCUMENTS

| | | | | |
|---|---|---|---|---|
| 2005/0120960 | A1* | 6/2005 | Chen | H01J 37/20 118/728 |
| 2006/0196605 | A1* | 9/2006 | Ikegami | H01J 37/32082 156/345.51 |
| 2006/0254717 | A1* | 11/2006 | Kobayashi | C23F 4/00 156/345.44 |
| 2007/0221332 | A1* | 9/2007 | Honda | H01J 37/32091 156/345.47 |
| 2008/0202689 | A1* | 8/2008 | Kim | H01J 37/32477 156/345.43 |
| 2009/0071938 | A1* | 3/2009 | Dhindsa | H01J 37/32091 216/67 |
| 2010/0243606 | A1* | 9/2010 | Koshimizu | H01J 37/32091 216/67 |
| 2011/0031217 | A1* | 2/2011 | Himori | H01J 37/32091 216/71 |
| 2011/0315320 | A1* | 12/2011 | Do | C23C 16/45565 156/345.34 |
| 2012/0222817 | A1* | 9/2012 | Hosaka | H01J 37/32422 156/345.44 |
| 2013/0087285 | A1* | 4/2013 | Kofuji | H01J 37/32082 156/345.33 |
| 2017/0278730 | A1* | 9/2017 | Tandou | H01L 21/67248 |

* cited by examiner

PLASMA PROCESSING APPARATUS

BACKGROUND OF THE INVENTION

1. Field of the Invention

The present invention relates to a plasma processor to process a sample of a substrate shape such as a semiconductor wafer disposed in a processing chamber using plasma formed in the processing chamber in a vacuum vessel such as in etching, asking, chemical vapor deposition (CVD), or the like.

2. Description of the Related Art

In order to improve yield rates of plasma etching steps in mass production of semiconductor devices, it is desirable to perform uniform processing over a surface of semiconductor wafers (hereinafter simply referred to as a wafer). Especially, uniformity of processing over a surface of critical dimensions (CDs) desired for etching steps to form transistors is increasingly stringent year by year.

When distribution of radical density on a wafer is ununiform upon etching, a radical is ununiformly incident on an etching pattern. As a result, this contributes to degradation of CD uniformity. In order to secure CD uniformity, therefore, a plasma etching apparatus to implement a uniform radical density on a wafer is important.

In general plasma etching apparatuses, an ion or a radical generated by plasma diffuses inside the apparatus and is thereby supplied onto the wafer. Radicals are, however, deactivated in the process of transfer to the wafer due to gas phase reactions or on an inner wall of a chamber of the etching apparatus and thus distribution of radical flux incident on the wafer tends to be ununiform.

As a method to cause the distribution of radical flux to be uniform, mounting, inside the etching apparatus, a means to additionally supply a radical is considered to be effective. For example, JP-09-162169-A discloses a configuration where a first plasma generating chamber set at a relatively high pressure environment is mounted to an outer peripheral portion of a second plasma generating chamber set at a relatively low pressure environment.

JP-2013-84653-A further discloses a configuration where a second high frequency power source to supply high frequency power and a gas introducing mechanism to supply second gas are arranged in an outer peripheral portion of a wafer, thereby generating plasma around the outer periphery of the wafer.

SUMMARY OF THE INVENTION

In many cases, even though it is desired to obtain an in-plane uniform CD using a general plasma etching apparatus, in practice, the CD varies near an outer periphery of a wafer (for example a region within approximately 30 mm from the outer peripheral edge of the wafer). It is assumed that this is because a radical incident on the wafer has a convex distribution where the radical decreases near the outer periphery of the wafer. Therefore, a means to efficiently control the radical density near the outer periphery of the wafer is desired.

Assumingly, the cases of applying JP-09-162169-A and JP-2013-84653-A to the above problem are considered. First, JP-09-162169-A discloses a configuration where a radical source is disposed at a position apart from an outer peripheral portion of a wafer. A radical generated in the first plasma generating chamber positioned at the outer peripheral portion of the wafer is supplied to the second plasma generating chamber where the wafer is placed.

The supplied radical diffuses inside the second plasma generating chamber and thus it is difficult to locally supply the radical to the vicinity of the outer periphery of the wafer. Moreover, the generated radical decreases in the process of reaching the wafer due to influence by a structure or exhaust ventilation and thus it is difficult to efficiently and stably supply the radical to the wafer. This shows that it is effective to supply the radical from a component closest to the outer periphery of the wafer in order to efficiently supply the radical to the outer peripheral portion of the wafer; however in JP-09-162169-A, no consideration is made from this perspective.

Meanwhile in the configuration of JP-2013-84653-A, generating plasma near a susceptor in an outer periphery of the wafer may allow for efficiently supplying the radical to the outer periphery of the wafer. However, generating the plasma results in not only an increase of radical density near the outer periphery of the wafer but also an increase of ion density.

Therefore, even though the radical density can be uniform on the wafer, the increase of ion density in the outer peripheral portion of the wafer may disadvantageously result in influences such as a base film of a processed film scraped more or loss of corners (deformation) of an etching mask pattern occurring in the outer peripheral portion of the wafer. Therefore, it is difficult to obtain a uniform working shape over a surface of the wafer.

An object of the present invention is to provide a technique to improve uniformity of plasma processing in an in-plane direction of a semiconductor wafer and thereby allowing for improving a yield rate of the plasma processing.

The above and other objects of the present invention and novel characteristics thereof will become clear from descriptions herein and accompanying drawings.

Of embodiments of the invention disclosed herein, an overview of a representative embodiment is simply described as follows.

A plasma processor according to an embodiment of the present invention includes a vacuum vessel where plasma processing is performed on a semiconductor wafer, a first gas supplier to supply first gas for generating first plasma inside the vacuum vessel, the first gas supplier connected to the vacuum vessel, a stage on which the semiconductor wafer is placed, an electromagnetic wave supplier to supply high frequency power for generating the first plasma, and a first high frequency power source to adjust ion energy incident on the wafer, the first high frequency power source connected to the stage. The plasma processor further includes a wafer holder provided to an outer peripheral portion of the stage and formed with an opening, a second high frequency power source connected to the wafer holder, a second gas supplier to supply second gas to the inside of the wafer holder, and a vacuum evacuator to evacuate and decompress the inside of the vacuum vessel. Furthermore, the inside of the wafer holder is provided with a high frequency electrode covered by a dielectric and connected to the second high frequency power source and a first earth electrode covered by a dielectric and disposed opposite to the high frequency electrode. The second high frequency power source supplies high frequency power while the second gas supplier supplies the second gas, thereby generating second plasma inside the wafer holder.

Of embodiments of the invention disclosed herein, effects obtained by the representative embodiment are simply described as follows.

The amount of a radical supplied to an outer peripheral portion of the wafer is increased and uniformity of distribution of the amount of the radical in an in-plane direction of the wafer is thereby improved. As a result of this, the yield rate of plasma processing of the wafer can be improved.

DESCRIPTION OF THE PREFERRED EMBODIMENTS

In the embodiments below, descriptions on the same or similar parts are basically not repeated unless particularly required.

In the embodiments below if desired for the sake of convenience, descriptions are given by dividing into a plurality of sections or embodiments. Unless particularly specified, these embodiments are not irrelevant to each other. One may be a variation, details, or supplementary descriptions of a part or all of another.

In the embodiments below when the number of elements (including the number of countables, values, amounts, ranges, etc.) is referred to, unless particularly specified or obviously limited to a particular number or value in principal, the embodiment is not limited to that particular number or value and may be larger than or smaller than the particular number or value.

In the embodiments below, unless particularly specified or obviously considered necessary in principal, it is not always necessary to include components (including component steps) of the embodiment.

In the embodiments below, when a component or the like is referred to as "formed by A", "having A", or "including A", unless particularly specified that only that element is included, the embodiment does not exclude other elements. Similarly in the embodiments below, when a shape, positional relation, or the like of components or the like is referred to, unless particularly specified or obviously considered otherwise in principal, those substantially approximate or similar to the shape or the like are also included. This similarly applies to the above values and ranges.

Hereinafter, embodiments of the present invention will be described in detail based on the drawings. Incidentally, in all the drawings for describing the embodiments, members having the same function are denoted with the same symbol and descriptions thereon are not repeated. For facilitating understanding of the drawings, even a plan view may be hatched.

Figure 1:
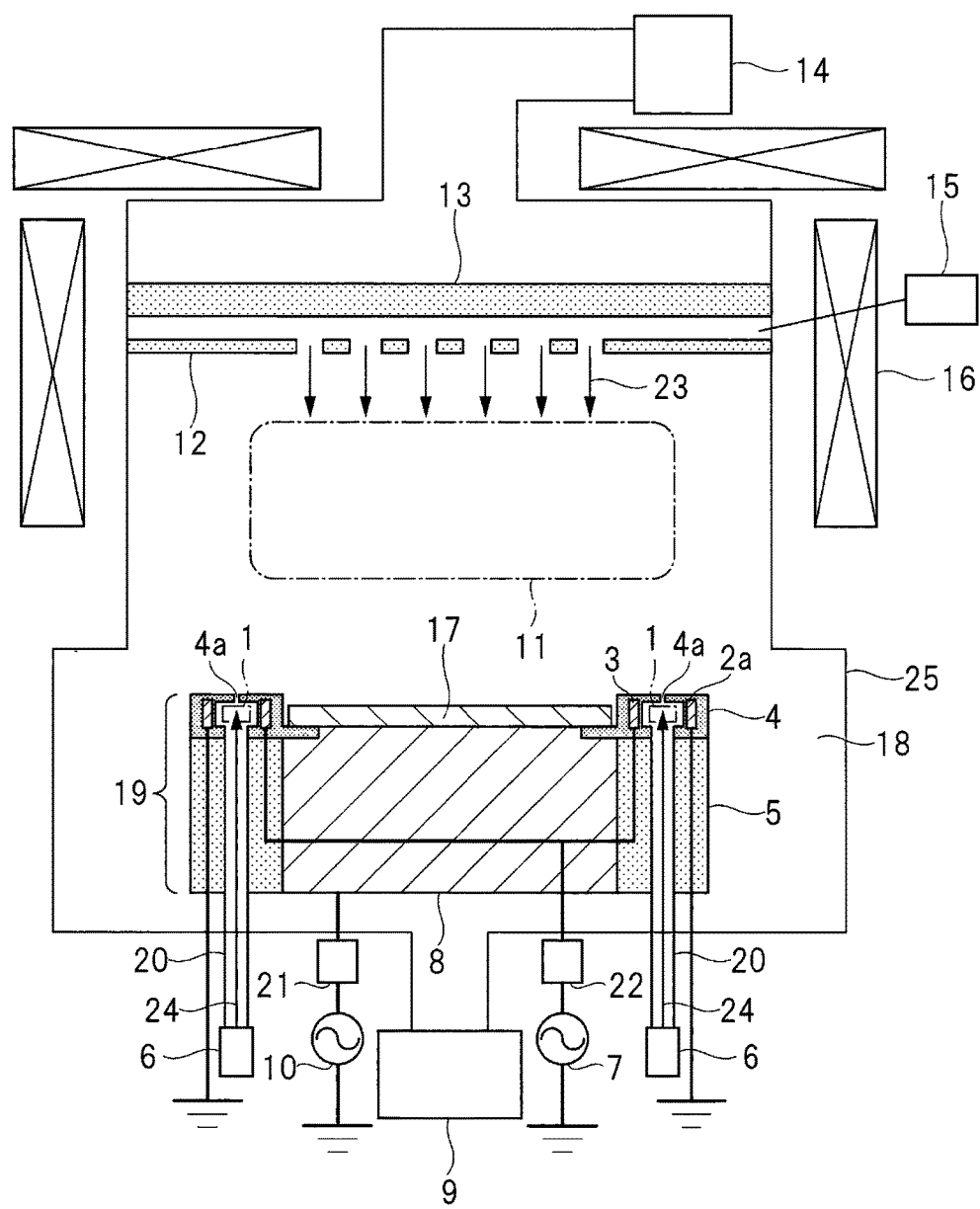
FIG. 1 is a schematic diagram illustrating an exemplary configuration of a plasma processor of an embodiment of the present invention.
Figure 2:
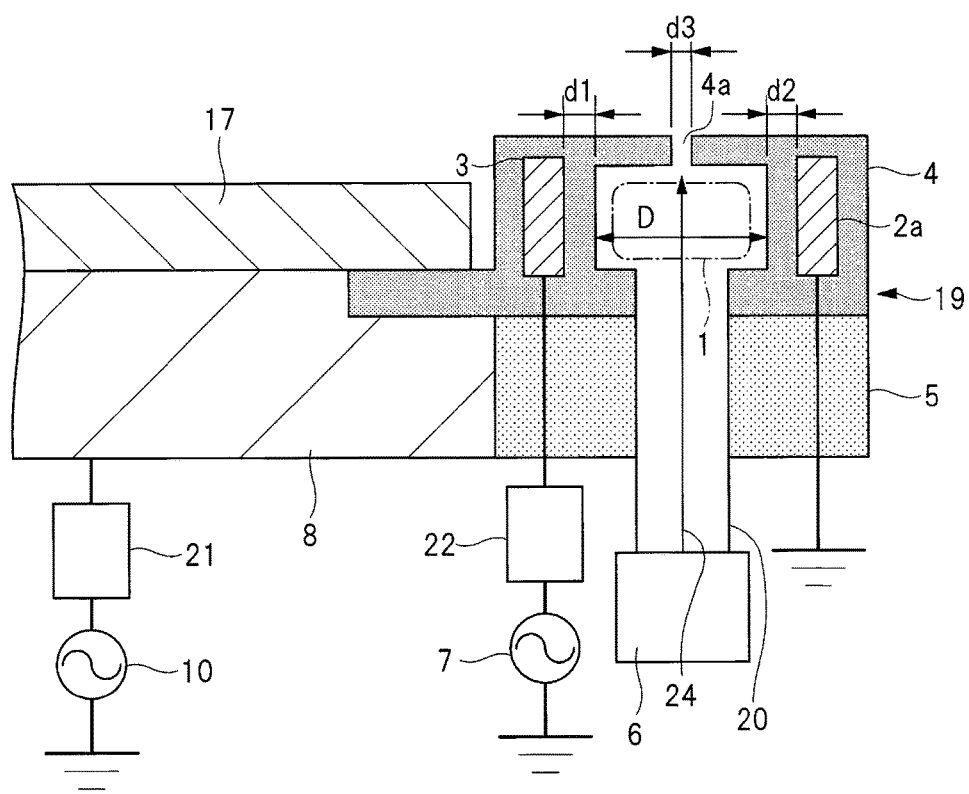
FIG. 2 is a partially-enlarged cross-sectional view illustrating an enlarged inner configuration of a susceptor in the plasma processor illustrated in FIG. 1.
Figure 3:
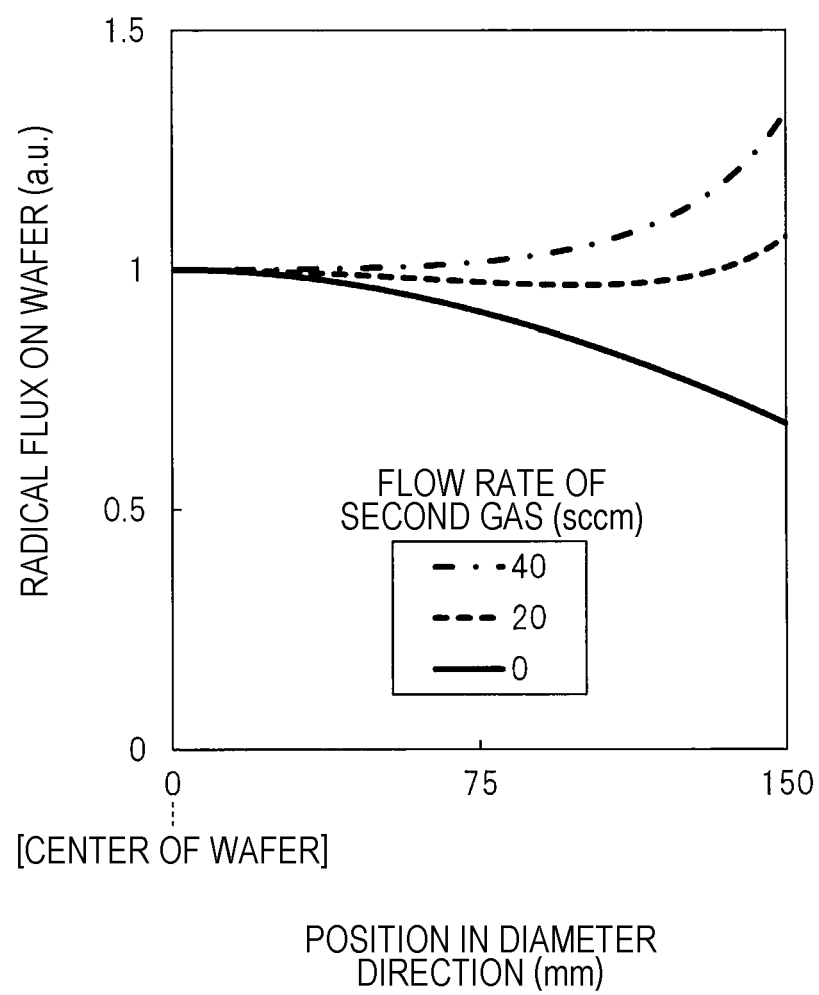
FIG. 3 is a diagram of data illustrating exemplary influence of the flow rate of second gas on radical flux on a wafer in the plasma processor illustrated in FIG. 1.

FIG. 1 is a schematic diagram illustrating an exemplary configuration of a plasma processor of an embodiment of the present invention. FIG. 2 is a partially-enlarged cross-sectional view illustrating an enlarged inner configuration of a susceptor in the plasma processor illustrated in FIG. 1. FIG. 3 is a diagram of data illustrating exemplary influence of the flow rate of second gas on radical flux on a wafer in the plasma processor illustrated in FIG. 1.

In the present embodiment, as an exemplary plasma processor, a plasma processor using electron cyclotron resonance (ECR) as an electrical discharge method will be described. The ECR is a method to form plasma utilizing resonance between a rotational frequency of electrons rotating around magnetic force lines and a microwave frequency.

Describing a configuration of the plasma processor illustrated in FIG. 1, the plasma processor includes a vacuum vessel 25, which can be decompressed, where plasma processing is performed on a semiconductor wafer 17 in a vacuum processing chamber 18 therein, a first gas supplier 15, connected to the vacuum vessel 25, to supply first gas for generating first plasma 11 inside the vacuum vessel 25, and a stage 19 on which the semiconductor wafer 17 is placed. The plasma processor further includes an electromagnetic wave supplier 14 to supply high frequency power for generating the first plasma 11, a first high frequency power source 10, connected to the stage 19, to supply high frequency power for adjusting ion energy incident on the wafer 17, a susceptor 4 which is a wafer holder formed with an opening 4a directed upward and is provided to an outer peripheral portion of the stage 19, a second high frequency power source 7 connected to the susceptor 4, and a second gas supplier 6 to supply second gas to the inside of the susceptor 4. The plasma processor further includes a vacuum evacuator 9 to evacuate and decompresses the inside of the vacuum processing chamber 18 of the vacuum vessel 25.

Incidentally, the susceptor 4 is also referred to as a susceptor ring. The inside of the susceptor 4 is provided with a high frequency electrode 3 covered by a dielectric and connected to the second high frequency power source 7 and a first earth electrode 2a covered by a dielectric and disposed opposite to the high frequency electrode 3.

In the plasma processor, the second high frequency power source 7 supplies high frequency power while the second gas supplier 6 supplies the second gas, thereby generating second plasma 1 inside the susceptor 4.

Here, the first gas for generating the first plasma introduced to the vacuum processing chamber 18 is introduced thereto from the first gas supplier 15 via a shower plate 12. In FIG. 1, arrows 23 illustrate the flow of the first gas. The kind or composition of the first gas is different depending to the kind of a material to be processed formed on the wafer 17 or a target working shape. In the present embodiment, the case of a plasma etching processor using silicon oxide as the material to be processed and gas containing fluorocarbon based gas as etching gas will be described.

The pressure in the vacuum processing chamber 18 is adjusted by the vacuum evacuator 9. Incidentally, the vacuum evacuator 9 employs a configuration where, for example, a dry pump or a turbo molecule pump is connected to a pressure control valve. The pressure in the vacuum processing chamber 18 can be controlled at a desirable value suitable for electric discharge by controlling an opening degree of the pressure control valve. In order to allow an ion to be incident on the wafer 17 with anisotropy, a pressure of approximately 0.1 to 100 Pa is generally used in etching processing.

Electromagnetic waves for generating the first plasma 11 are supplied from the electromagnetic wave supplier 14 and introduced into the vacuum processing chamber 18 via a dielectric window 13 formed by a material that transmits electromagnetic waves. For example, the electromagnetic waves are microwaves having a frequency of 2.45 GHz and the dielectric window 13 is formed by a material that transmits microwaves such as quartz. An electromagnetic coil 16 generates a magnetic field required for ECR in the vacuum processing chamber 18. For example, a magnetic flux density required for ECR for microwaves of 2.45 GHz is 875 G. In the vicinity of the magnetic field required for ECR, the microwaves efficiently accelerate electrons and electrons with high energy are thus obtained. The electrons with high energy ionize molecules of the etching gas. This allows for obtaining the first plasma 11.

The stage 19 to support the wafer 17 includes a wafer placement electrode 8, the susceptor 4 disposed along the vicinity of the outer peripheral portion of the wafer 17, and a covering 5 to support the susceptor 4. The wafer placement electrode 8 is connected to the first high frequency power source 10 via a first matcher 21. That is, the first high frequency power source 10 is connected to the first matcher 21. Incidentally, in order to control ion energy incident on the wafer 17, output of the first high frequency power source 10 is adjusted. A frequency of the first high frequency power source 10 may be any value as long as desired ion energy distribution can be obtained. In the present embodiment, for example a high frequency of 400 kHz is applied.

Charged particles generated by the first plasma 11 are transported while caught by magnetic force lines formed by the electromagnetic coil 16. Therefore, distribution of ion flux on the wafer 17 can be controlled by, for example controlling the magnetic field formed by the electromagnetic coil 16. Meanwhile, an electrically neutral radical is not influenced by the magnetic field and is transported mainly by diffusion and a gas stream. The radical diffuses while being transported to the wafer 17 and is deactivated by adherence to an inner wall of the vacuum processing chamber 18 or surface reaction therewith. Thus, the radical flux incident on the wafer 17 often has a convex distribution. That is, the distribution of the radical flux incident on the wafer 17 decreases in the outer peripheral portion as compared to the central portion of the wafer 17.

Therefore, in order to allow the working shape of etching to be uniform over a surface of the wafer, it is necessary to increase the radical in short in the outer peripheral portion of the wafer 17. Thus, the second gas supplier 6 supplies the second gas to the inside of the susceptor 4 mounted to the outer periphery of the wafer 17. The second gas is thereby caused to be plasma inside the susceptor 4 between the high frequency electrode 3 and the first earth electrode 2a. A radical is thereby generated and supplied to the vacuum processing chamber 18. In FIG. 1, an arrow 24 illustrates a stream of the second gas. The kind of the second gas is selected as appropriate according to the kind of a radical desired to be increased in the outer peripheral portion of the wafer. In the present embodiment, fluorocarbon based gas is introduced similarly to the first gas.

Next, the second plasma 1 generated inside the susceptor 4 will be described with the enlarged view in FIG. 2. The inside of the susceptor 4 is mounted with the high frequency electrode 3 connected to the second high frequency power source 7 via a second matcher 22 and the first earth electrode 2a disposed opposite to the high frequency electrode 3. That is, the second high frequency power source 7 is connected to the second matcher 22. The susceptor 4 is formed by a dielectric having high plasma-resistance, for example quartz. That is, both of the high frequency electrode 3 and the first earth electrode 2a are covered by the susceptor 4 which is a dielectric. Here, each of the high frequency electrode 3 and the first earth electrode 2a is formed into a ring shape along the outer peripheral portion of the wafer 17. Therefore, the susceptor 4 covering the high frequency electrode 3 and the first earth electrode 2a is also formed into a ring shape along the outer peripheral portion of the wafer 17.

In order to prevent power from each of the first high frequency power source 10 and the second high frequency power source 7 from flowing to the other power source, the first matcher 21 includes a filter to cut (remove) a frequency component of the second high frequency power source 7 and, furthermore, the second matcher 22 includes a filter to cut (remove) a frequency component of the first high frequency power source 10. That is, the first matcher 21 includes the filter to cut a frequency component of the second high frequency power source 7 and the second matcher 22 includes the filter to cut a frequency component of the first high frequency power source 10, thereby allowing for preventing power from each of the first high frequency power source 10 and the second high frequency power source 7 from flowing to the other power source. As the filter, a suitable filter is used as appropriate according to a frequency desired to be cut (removed) such as a low-pass filter or a high-pass filter.

In the plasma processor of the present embodiment, the second high frequency power source 7 supplies high frequency power and generates the second plasma 1 between the high frequency electrode 3 and the first earth electrode 2a. To the high frequency electrode 3, for example high frequency power of several tens to several hundreds watts is supplied at a frequency of several tens kHz to several hundreds MHz. In order to efficiently apply a voltage to a discharge space D in FIG. 2, thicknesses d1 and d2 of quartz in a diameter direction from the first earth electrode 2a or the high frequency electrode 3 are desired to be as thin as possible without impairing mechanical strength or causing dielectric breakdown. The thicknesses d1 and d2 of quartz are for example several millimeters. In the present embodiment, surfaces of the high frequency electrode 3 and the first earth electrode 2a are buried inside the susceptor 4 and thereby covered by the dielectric. The reason for covering the surfaces of the high frequency electrode 3 and the first earth electrode 2a by the dielectric is to avoid that, when the surfaces of the high frequency electrode 3 and the first earth electrode 2a are exposed to the second plasma 1, the surfaces of the high frequency electrode 3 and the first earth electrode 2a are subjected to sputtering by the ion, thereby diffusing, in the vacuum processing chamber 18, metal particles of a component element of the electrode. For example when metal particles, which is unnecessary for a transistor forming step as one of mass production steps of semiconductor devices, are incident on the wafer 17, this leads to degradation of performance such as an increase of leakage current in the transistor, which results in a decreased yield rate. In the present embodiment the example where the first earth electrode 2a and the high frequency electrode 3 are buried inside the susceptor 4 has been described; however, the surfaces of the first earth electrode 2a and the high frequency electrode 3 may be protected by another dielectric member such that the first earth electrode 2a and the high frequency electrode 3 are not directly exposed to the second plasma 1.

Inside the susceptor 4 and the covering 5 mounted thereunder, a gas flow path 20 connected to the second gas supplier 6 is included. The ring-shaped susceptor 4 is further formed with an opening 4a along a circumferential direction thereof. The opening 4a is a gas outlet of a slit shape having a width d3. This opening 4a has a width d3 narrower than a width D of the discharge space where the second plasma 1 is formed (d3<D). This is for allowing conductance to be small by narrowing the width of the opening 4a which is an outlet of the second gas and thereby allowing a pressure in the discharge space of the second plasma 1 to be higher than a pressure in the vacuum processing chamber 18. This allows for adjusting at a suitable pressure upon initiation of electric discharge. That is, since the width d3 of the opening 4a in the susceptor 4 is narrower than the width D of the discharge space where the second plasma 1 is formed (d3<D), a pressure in the discharge space of the second plasma 1 is allowed to be higher than a pressure in the vacuum processing chamber 18, thereby allowing for adjusting at a suitable pressure upon initiation of electric discharge. For example, assuming that a distance between the high frequency electrode 3 and the first earth electrode 2a is 2 cm and a frequency of the second high frequency power source 7 is 4 MHz. Here, a suitable pressure where a minimum voltage upon initiation of electric discharge can be obtained is several tens pascals (Kadhim et al., International Journal of Application or Innovation in Engineering & Management, vol. 3, 454 (2014)). Furthermore, since the opening 4a as the gas outlet of the susceptor 4 is narrower than the width D of the discharge space where the second plasma 1 is formed, the ion generated by the second plasma 1 can be prevented from flowing to the vacuum processing chamber 18, thereby allowing for suppressing an increase of ion density in the outer periphery of the wafer.

Next, in order to examine influence of the radical supplied from the opening 4a of the susceptor 4 on radical flux distribution on the wafer, influence of a flow rate of the second gas on the radical flux on the wafer was calculated. For simplicity of description, in the calculation the amount of generated radical in the first plasma 11 was fixed and furthermore the flow rate of the first gas was regarded as 200 sccm while the pressure in the vacuum processing chamber 18 was regarded as 1.0 Pa.

Moreover, the amount of generated radical in the second plasma 1 was assumed to be proportional to the flow rate of the second gas. A formula of advective diffusion of radical was solved and a radical flux distribution on the wafer was obtained. The result is illustrated in FIG. 3. To facilitate comparison of distribution shapes of radical flux on the wafer, the distribution was normalized at radical flux in the center of the wafer (a portion at a position of 0 mm in the diameter direction). A solid line in FIG. 3 represents the result with a flow rate of the second gas of 0 sccm. Radical flux distribution is convex distribution (a distribution state where the amount of radical is large in the central portion of the wafer while the amount of radical is small in the outer peripheral portion of the wafer). When the flow rate of the second gas is increased to 20 sccm, radical flux in the outer peripheral portion of the wafer (position at 150 mm in the diameter direction) relatively increases as compared that in the central portion of the wafer (position at 0 mm in the diameter direction), thereby allowing distribution of radical flux on the wafer 17 in the diameter direction to be relatively uniform. Moreover, when the flow rate of the second gas is 40 sccm, radical flux in the outer peripheral portion of the wafer further increases, which can cause the radical flux distribution to be a concave shape. The above shows that supplying radical from the susceptor 4 can cause radical flux distribution on the wafer having a convex distribution to be uniform.

According to the plasma processor of the present embodiment, the inside of the susceptor 4 is provided with the high frequency electrode 3 and the first earth electrode 2a. The second high frequency power source 7 supplies power to the high frequency electrode 3 while the second gas is supplied, thereby allowing for generating the second plasma 1 in the susceptor 4. Here, with the power from the second high frequency power source or the flow rate of the second gas, the amount of generated radical generated in the second plasma 1 or the amount of radical supplied to the vacuum processing chamber 18 is controlled, thereby allowing for controlling the amount of radical supplied to the outer peripheral portion of the wafer.

This allows for efficiently controlling a profile of radical flux distribution incident on the wafer 17 at the outer peripheral portion thereof, thereby allowing the working shape over the surface of the wafer after etching to be uniform.

That is, the amount of a radical supplied to an outer peripheral portion of the wafer 17 is increased and thereby uniformity of distribution of the amount of radical in an in-plane direction of the wafer 17 is improved. As a result of this, a yield rate of plasma processing of the wafer 17 can be improved.

In other words, uniformity of plasma processing in an in-plane direction of the wafer 17 can be improved and thereby allowing for improving a yield rate of the plasma processing.

Next, variations of the present embodiment will be described.

In the above embodiment, the case where the opening 4a, which is the outlet of the second gas, of the ring-shaped susceptor 4 is formed into a slit shape along the circumferential direction thereof has been described; however, a plurality of gas holes (openings 4a) may be separately disposed in the circumferential direction thereof. That is, the plurality of openings 4a may be separately formed along the circumferential direction of the ring-shaped susceptor 4. In this case, the second gas supplier 6 does not necessarily supply gas with one system but may separately supply the second gas to the respective gas holes (respective openings 4a). Such a configuration allows for separately controlling a flow rate of gas with respect to the respective gas holes (respective openings 4a), and thus not only radical flux distribution in the diameter direction of the wafer 17 but also radical flux distribution in the circumferential direction of the wafer 17 can be controlled.

Figure 4:
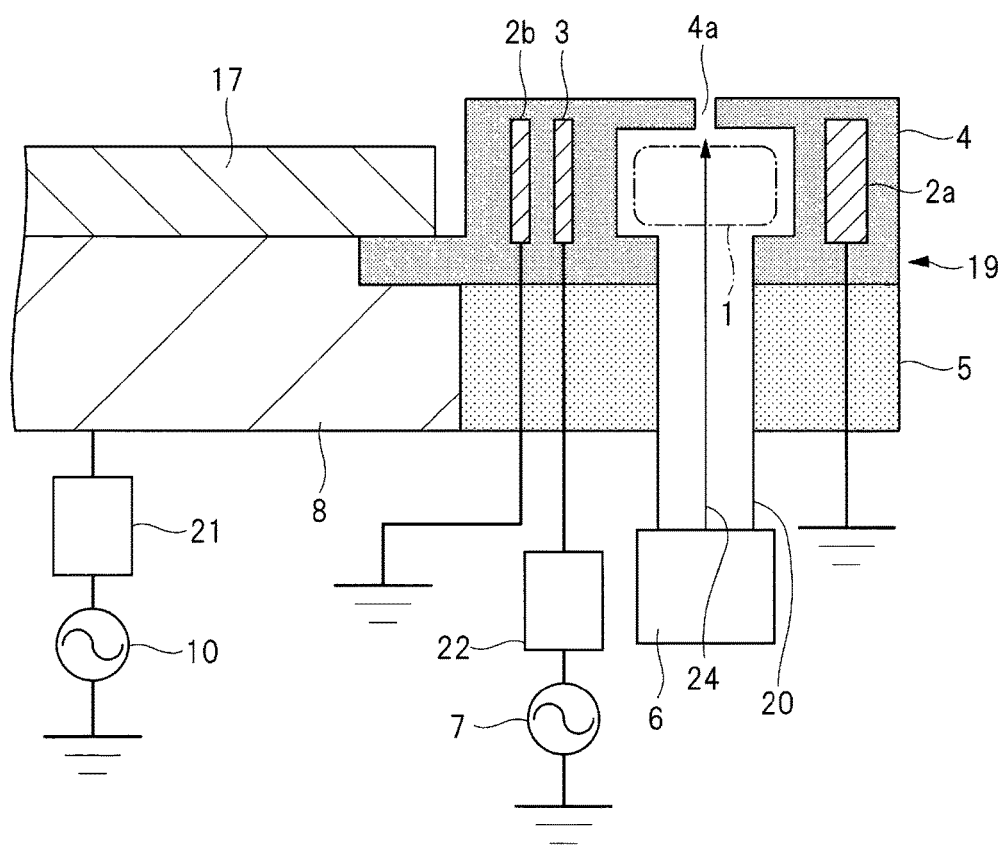
FIG. 4 is a partially-enlarged cross-sectional view illustrating an inner configuration of a susceptor in a plasma processor of a first variation of the embodiment of the present invention.
Figure 5:
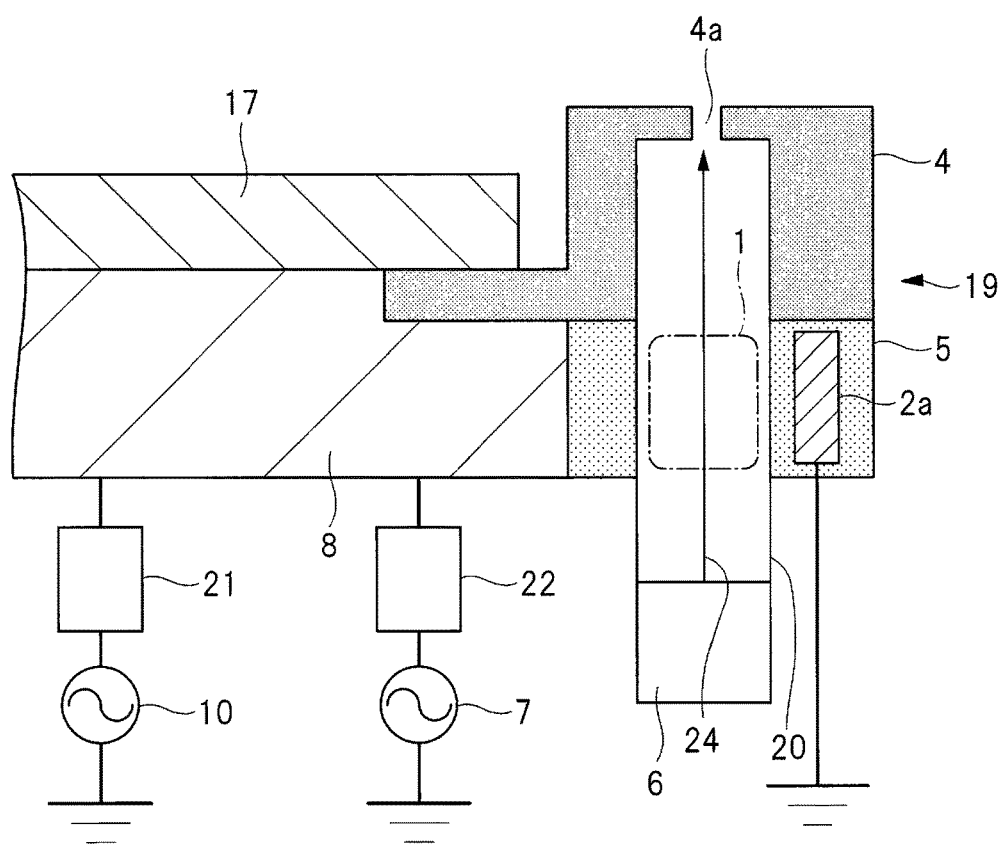
FIG. 5 is a partially-enlarged cross-sectional view illustrating an inner configuration of a susceptor in a plasma processor of a second variation of the embodiment of the present invention.

Next, a first variation and a second variation of the present embodiment will be described. FIG. 4 is a partially-enlarged cross-sectional view illustrating an inner configuration of a susceptor in a plasma processor of a first variation of the embodiment of the present invention. FIG. 5 is a partially-enlarged cross-sectional view illustrating an inner configuration of a susceptor in a plasma processor of a second variation of the embodiment of the present invention.

The first variation illustrated in FIG. 4 has the configuration described in FIG. 2 and further includes a second earth electrode 2b disposed between a wafer placement electrode 8 of a stage 19 connected with a first high frequency power source 10 and a high frequency electrode 3. That is, the second earth electrode 2b is disposed between the wafer placement electrode 8 connected with the first high frequency power source 10 and the high frequency electrode 3 connected with a second high frequency power source 7.

The second earth electrode 2b serves as an electrostatic shield to avoid interference between high frequency power from the first high frequency power source 10 and high frequency power from the second high frequency power source 7. That is, interference between high frequency power from the first high frequency power source 10 and high frequency power from the second high frequency power source 7 can be prevented by disposing the second earth electrode 2b therebetween.

Next, the second variation illustrated in FIG. 5 will be described. The second variation illustrated in FIG. 5 illustrates a device configuration that allows for easy implementation to the plasma processor. In the configuration described in FIG. 2, a wafer placement electrode 8 is connected to a first high frequency power source 10 via a first matcher 21. Here, a second high frequency power source 7 is also connected to the wafer placement electrode 8 via a second matcher 22. Furthermore, a first earth electrode 2a is buried in a covering 5. The covering 5 is formed by quartz or the like having high plasma-resistance. The first high frequency power source 10 is used mainly for the purpose of controlling ion energy incident on a wafer 17.

Meanwhile, the second high frequency power source 7 is used mainly for the purpose of generating the second plasma 1 inside a susceptor 4. As compared to the configuration illustrated in FIG. 2 where a high frequency electrode 3 is buried inside the susceptor 4, the plasma processor illustrated in FIG. 5 allows for simplifying configurations of the susceptor 4 and the covering 5 and thus allows for easy implementation of members to the device.

In the present embodiment, the example of using ECR as the electric discharge method for generating the first plasma 11 has been described; however, other electric discharge methods may be used such as inductively coupled plasma (ICP).

Furthermore in the present embodiment, various embodiments of the inner configuration of the susceptor 4 or the covering 5 have been described with FIGS. 2, 4, and 5; however, the plasma processor of the present embodiment may employ a combination thereof.

Moreover in the present embodiment, the susceptor 4 and the covering 5 are separate parts; however, they may be integrally configured. Alternatively, the susceptor 4 and the covering 5 may be configured by a plurality of parts in combination.

A part of the contents described in the embodiments is described below.
First Aspect A plasma processor, including a vacuum vessel which can be decompressed, a first gas supplier to supply gas for generating plasma, the first gas supplier connected to the vacuum vessel, a vacuum evacuator, an electromagnetic wave supplier to supply high frequency power for generating first plasma, the electromagnetic wave supplier connected to the vacuum vessel, a stage on which a wafer is placed, the stage connected to a second high frequency power source, and a first high frequency power source connected to the stage, where a susceptor is mounted to an outer peripheral portion of the stage, the susceptor is provided with a gas flow path, where second gas flows, connected to a second gas supplier, a high frequency electrode covered by a dielectric and connected to the second high frequency power source, and an earth electrode covered by a dielectric, and the second high frequency power source supplies power, second plasma is generated in the gas flow path of the susceptor through which the second gas passes, and the susceptor supplies a radical to an outer peripheral portion of the wafer.

Second Aspect

A plasma processor, including a vacuum vessel which can be decompressed, a first gas supplier to supply gas for generating plasma, the first gas supplier connected to the vacuum vessel, a vacuum evacuator, an electromagnetic wave supplier to supply high frequency power for generating first plasma, the electromagnetic wave supplier connected to the vacuum vessel, a stage on which a wafer is placed, and a first high frequency power source connected to the stage, where the stage is connected to a second high frequency power source, a susceptor is mounted to an outer peripheral portion of the stage, the susceptor is provided with a gas flow path, where second gas flows, connected to a second gas supplier, and an earth electrode covered by a dielectric, and the first high frequency power source and the second high frequency power source supply power, second plasma is generated in the gas flow path of the susceptor through which the second gas passes, and the susceptor supplies a radical to an outer peripheral portion of the wafer.

The invention devised by the present inventors has been specifically descried above based on the embodiments of the invention; however, the present invention is not limited to the aforementioned embodiments of the invention and may of course include various modifications without departing from the principals thereof.

Incidentally, the present invention is not limited to the aforementioned embodiments and may include various variations. For example, the aforementioned embodiments are described in detail in order to facilitate understanding of the present invention and thus the present invention is not necessarily limited to the one including all of the configurations having been described.

A part of a configuration of one of the embodiments may be replaced with a configuration of another embodiment. Also, a configuration of one of the embodiments may be added with a configuration of another embodiment. Moreover, a part of a configuration of each of the embodiments may be added with, deleted of, or replaced with another configuration. Incidentally, the respective members or relative sizes described in the drawings are simplified and/or idealized to facilitate understanding of descriptions on the present invention and thus they have more complicated shapes in implementation.

In the embodiments above, as an exemplary plasma processor, the case of the plasma etching processor has been described; however, the plasma processor may be another plasma processor to perform asking or chemical vapor deposition (CVD) processing on a sample of a substrate shape such as a semiconductor wafer.

What is claimed is:
1. A plasma processing apparatus, comprising:
a processing chamber disposed inside a vacuum vessel and, in the processing chamber, a first gas is supplied and a first plasma for processing a wafer is generated using the first gas;
a stage disposed in the processing chamber and the wafer is mounted on an upper surface of the stage;
a ring-shaped member which is constituted of a dielectric material and is disposed on an outer peripheral portion of the stage and surroundinq the upper surface of the stage, the ring-shaped member defining a discharge space in which a second gas is supplied and a second plasma is generated using the second gas;

a vacuum evacuator which is coupled to the vacuum vessel and is configured to evacuate and decompress the inside of the processing chamber, a first electrode which is disposed inside the stage and to which a first high frequency power source is electrically connected and a first high frequency power therefrom is supplied;

a second electrode and a third electrode which are disposed sandwiching the discharge space inside the ring-shaped member, where the second electrode is electrically connected to a second high frequency power source and supplied a second high frequency power therefrom, and the third electrode is connected to a ground potential;

wherein a surface of the ring-shaped member defines an opening which is in communication with the discharge space and the processing chamber and which is configured to supply particles of the second plasma into the processing chamber.

2. The plasma processing apparatus according to claim 1, wherein the discharge space and each of the second and third electrodes are in a ring shape disposed along a circumferential direction of the ring-shaped member.

3. The plasma processing apparatus according to claim 1, wherein the dielectric material is quartz.

4. The plasma processing apparatus according to claim 1, wherein the first high frequency power source is electrically connected to the first electrode via a first matcher, and the second high frequency power source is electrically connected to the second electrode via a second matcher.

5. The plasma processing apparatus according to claim 4, wherein the first matcher comprises a filter to remove a frequency component of the second high frequency power source, and the second matcher comprises a filter to remove a frequency component of the first high frequency power source.

6. The plasma processing apparatus according to claim 1, wherein the opening is configured by a slit disposed along a circumferential direction of the ring-shaped member.

7. The plasma processing apparatus according to claim 6, wherein a width of the slit is narrower than a width of the discharge space along a radial direction of the ring-shaped member.

8. The plasma processing apparatus according to claim 1, wherein a plurality of the openings are disposed separately along a circumferential direction of the ring-shaped member.

9. The plasma processing apparatus according to claim 1, further comprising:

a plurality of flow paths through which the second gas is separately supplied to the inside of the discharge space in a circumferential direction of the ring-shaped member.

10. The plasma processing apparatus according to claim 1, further comprising a fourth electrode which is provided between the first electrode and the second electrode in the ring-shaped member and is electrically connected to ground potential, wherein the second electrode is disposed between the first electrode and the discharge space in the ring-shaped member.

* * * * *